US009340462B2

United States Patent
Harris et al.

(10) Patent No.: US 9,340,462 B2
(45) Date of Patent: May 17, 2016

(54) TRANSIENT LIQUID PHASE, PRESSURELESS JOINING OF ALUMINUM NITRIDE COMPONENTS

(71) Applicants: Jonathan H. Harris, Scottsdale, AZ (US); Frank J. Polese, San Diego, CA (US); Robert J. Tesch, Phoenix, AZ (US); Stephen P. Nootens, San Diego, CA (US); Sorin Dinescu, San Diego, CA (US); William L. Bradbury, San Diego, CA (US); Casey C. Clausen, Portland, CA (US)

(72) Inventors: Jonathan H. Harris, Scottsdale, AZ (US); Frank J. Polese, San Diego, CA (US); Robert J. Tesch, Phoenix, AZ (US); Stephen P. Nootens, San Diego, CA (US); Sorin Dinescu, San Diego, CA (US); William L. Bradbury, San Diego, CA (US); Casey C. Clausen, Portland, CA (US)

(73) Assignee: Oasis Materials Corporation, Poway, CA (US)

( * ) Notice: Subject to any disclaimer, the term of this patent is extended or adjusted under 35 U.S.C. 154(b) by 41 days.

(21) Appl. No.: 13/842,465

(22) Filed: Mar. 15, 2013

(65) Prior Publication Data

US 2013/0319762 A1 Dec. 5, 2013

Related U.S. Application Data

(63) Continuation-in-part of application No. PCT/US2013/028473, filed on Feb. 28, 2013.

(60) Provisional application No. 61/605,157, filed on Feb. 29, 2012.

(51) Int. Cl.
*C04B 37/00* (2006.01)
*B32B 18/00* (2006.01)

(Continued)

(52) U.S. Cl.
CPC .............. *C04B 37/005* (2013.01); *B32B 18/00* (2013.01); *C04B 35/581* (2013.01);
(Continued)

(58) Field of Classification Search
CPC .................. C04B 2337/066; C04B 2337/366; C04B 2337/765; C04B 2337/80; C04B 2237/066; C04B 2237/366; C04B 2237/765; C04B 2237/80; C04B 35/581; Y10T 29/49126; Y10T 29/49155; B32B 18/00; H01L 21/68785; H01L 21/68792
See application file for complete search history.

(56) References Cited

U.S. PATENT DOCUMENTS

| 4,799,983 A | 1/1989 | Desai |
| 5,059,770 A | 10/1991 | Mahawili |

(Continued)

FOREIGN PATENT DOCUMENTS

WO      WO 98/42636 A1    10/1998

OTHER PUBLICATIONS

PCT Search Report and Written Opinion from corresponding Application No. PCT/US2013/028473.

*Primary Examiner* — Livius R Cazan
(74) *Attorney, Agent, or Firm* — Charmasson, Buchara & Leach, LLP

(57) ABSTRACT

A monolithic, substantially hermetic joining or bonding of two or more aluminum nitride ("AlN") ceramic components is made by promoting transient liquid phase sintering near the contact areas between the components. In a first approach, AlN particles are combined with a rare earth oxide sintering additive such as yttrium oxide ($Y_2O_3$) in a joining paste can be applied between the joining surfaces of fired ceramic preformed components prior to final firing to weld the components together. In a second approach, the additive is added to green mixture, and the components having different shrinkage aspect ratios are mated and cofired in an atmosphere containing a partial pressure of the additive. The additive encourages wetting and diffusion of the liquid phases present on the surfaces of ceramic interface particles in the contact areas during final firing.

11 Claims, 11 Drawing Sheets

(51) Int. Cl.
  *H01L 21/67* (2006.01)
  *H01L 21/687* (2006.01)
  *H05K 13/00* (2006.01)
  *C04B 35/581* (2006.01)
  *C04B 35/628* (2006.01)

(52) U.S. Cl.
  CPC ........ C04B 35/62813 (2013.01); C04B 37/001 (2013.01); H01L 21/67103 (2013.01); H01L 21/67109 (2013.01); H01L 21/67248 (2013.01); H01L 21/68785 (2013.01); H01L 21/68792 (2013.01); H05K 13/0023 (2013.01); *C04B 2235/3225* (2013.01); *C04B 2235/3865* (2013.01); *C04B 2235/5436* (2013.01); *C04B 2235/6581* (2013.01); *C04B 2235/6582* (2013.01); *C04B 2235/6587* (2013.01); *C04B 2235/668* (2013.01); *C04B 2235/77* (2013.01); *C04B 2235/85* (2013.01); *C04B 2235/9607* (2013.01); *C04B 2235/9615* (2013.01); *C04B 2237/064* (2013.01); *C04B 2237/066* (2013.01); *C04B 2237/08* (2013.01); *C04B 2237/366* (2013.01); *C04B 2237/555* (2013.01); *C04B 2237/568* (2013.01); *C04B 2237/60* (2013.01); *C04B 2237/68* (2013.01); *C04B 2237/704* (2013.01); *C04B 2237/765* (2013.01); *C04B 2237/84* (2013.01); *Y10T 156/10* (2015.01); *Y10T 403/479* (2015.01)

(56) References Cited

U.S. PATENT DOCUMENTS

| | | | |
|---|---|---|---|
| 5,207,437 | A | 5/1993 | Barnes et al. |
| 5,490,228 | A | 2/1996 | Soma et al. |
| 5,650,199 | A | 7/1997 | Chang et al. |
| 5,671,116 | A | 9/1997 | Husain |
| 5,740,016 | A | 4/1998 | Dhindsa |
| 5,804,289 | A * | 9/1998 | Wakamatsu ................. 428/212 |
| 6,376,811 | B2 | 4/2002 | Yamaguchi et al. |
| 6,387,507 | B1 | 5/2002 | Jones, II et al. |
| 6,508,884 | B2 * | 1/2003 | Kuibira et al. ............... 118/725 |
| 6,921,881 | B2 * | 7/2005 | Ito et al. .................... 219/145.22 |
| 2003/0066587 | A1 | 4/2003 | Yushio et al. |
| 2004/0175549 | A1 * | 9/2004 | Ito ................................. 428/209 |
| 2008/0236479 | A1 | 10/2008 | Kiku et al. |
| 2009/0056987 | A1 | 3/2009 | Nomiya et al. |
| 2009/0130459 | A1 | 5/2009 | Kuenzler et al. |
| 2011/0000426 | A1 | 1/2011 | Herchen |

* cited by examiner

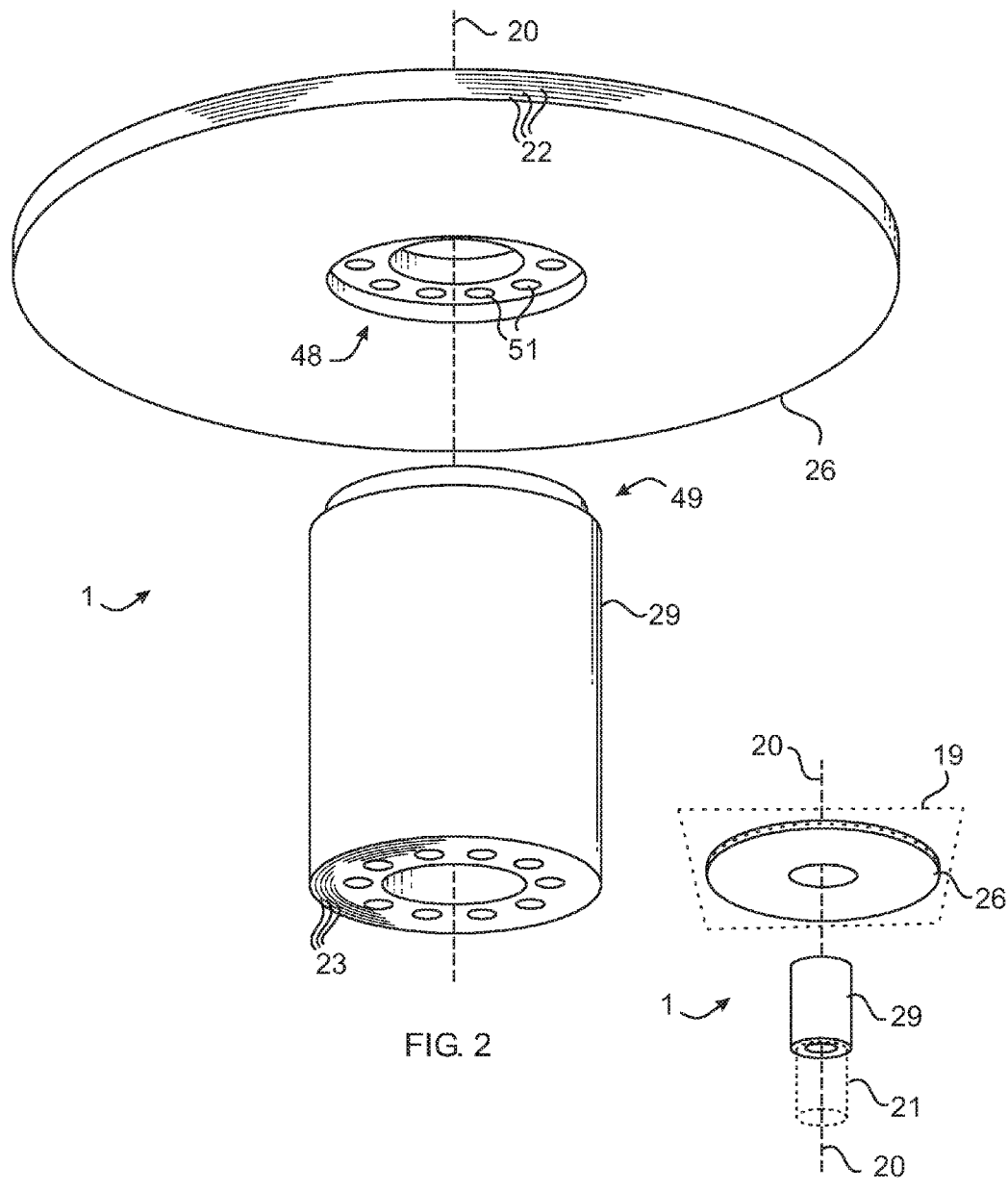

TRANSIENT LIQUID PHASE, PRESSURELESS JOINING OF ALUMINUM NITRIDE COMPONENTS

PRIOR APPLICATION

This application is a continuation-in-part of co-pending International Application Serial No. PCT/US13/28473, filed 2013 Feb. 28, designating the U.S. and incorporated herein by reference, and which claims the benefit of U.S. Provisional Patent Application Ser. No. 61/605,157, filed 29 Feb. 2012, incorporated herein by reference.

FIELD OF THE INVENTION

The instant invention relates to microelectronics manufacturing and more particularly to the hermetic bonding together of separate ceramic components.

BACKGROUND

The microelectronics industry is constantly striving for further miniaturization of components to increase speed and functionality of electronic systems. This has led to the fabrication of highly complex integrated circuits on wafers of semiconductors such as silicon. In order to enhance the yield of usable integrated circuits on a given fabricated wafer, many processing techniques and apparatuses have been developed.

Wafer processing occurs in an enclosed vessel, often called a process chamber. Strict control of the process environment is required to keep the in-process wafer free of contaminants, and to expose it to necessary processing environments including specialized atmospheres for cleaning, etching, doping and deposition of materials through plasma processing such as sputtering or plasma etching.

One primary component of the wafer process chamber is the substrate support structure, often called a susceptor, or sometimes referred to as a "heater chuck" or simply "chuck". The susceptor provides support for the wafer in the vessel and provides for sophisticated control of temperature during processing. Typically, the susceptor has a disk-shaped top plate upon which the wafer is held. The plate is supported by a central downwardly extending tube or pedestal. In some fabrication vessels, the plate can have an outer diameter of up to 55 centimeters.

It is well known that a susceptor can carry a number of structures including electrically resistive heating elements and thermal sensors such as "resistance temperature detector" (RTD) lines to help monitor and control the temperature of the wafer during processing. During wafer processing steps it is typically preferred to maintain the susceptor plate and the wafer at a high level of temperature uniformity. The heating elements and RTD sensors can be made up of a number of serpentine electrically resistive traces formed within the plate. The plate can be divided into a number of distinct zones, each having a dedicated number of separately energizable heating elements and sensors. Thus, a zone of a wafer located over a zone on the susceptor can be heated independently from the other zones. A hollow connecting tube or pedestal extends from the plate and is adapted to carry electrical power lines to the heating elements, electrical signal-carrying lines from the sensors, and electrical grounding lines for shielding structures. Other purposes of the pedestal can include pathways for process gasses, liquids, and vacuum channels into the chamber.

One problem with the above susceptor design is that the tube can only accommodate a limited number of wires to electrically interconnect large number of electrical elements on the plate due to geometric constraints.

Yushio et al., U.S. Patent publication No. 2003/0066587, incorporated herein by reference, teaches making a susceptor using aluminum nitride. Desai, U.S. Pat. No. 4,799,983, incorporated herein by reference, teaches the use of alumina in multilayer ceramic (MLC) technology.

In general, MLC technology involves mixing particles of high temperature-withstanding ceramic dielectric material such as alumina with an organic binder, which is then tape-cast, dried and separated into a number of flexible "green sheets". Some of the sheets have via holes punched and are then screened and printed with metalization and other circuit patterns which, when stacked with other sheets, can form intricate three-dimensional electronic structures such as traces and contact pads. The stacked sheets are laminated together at a predetermined temperature and pressure to form a "green state" part. Depending on the type of ceramic particles used, the part can then be slowly heated in a binder burn-off routine to about 600 degrees C. which burns off a majority of the binder material. The resultant fragile baked-out or debound part is then fired at an elevated temperature routine in a reducing atmosphere such as humidified hydrogen-nitrogen upon which any residual amount of the binder material vaporizes off while the remaining material fuses and/or sinters into a solid ceramic body having embedded metallic electrical circuitry. Where alumina is used as the electrically insulating material, firing can typically reach 1600 degrees C. Refractory metals such as tungsten and molybdenum are often used for metalization.

Debound parts can contain significant void content corresponding to the removed binder. During the final firing process, the parts will shrink significantly as the material densifies. Shrinkage may not be uniform resulting in localized stresses on the part potentially leading to structural disuniformities including cracks. Two differently sized or shaped pre-fired ceramic parts would likely not be connected to one another and fired together because differences in the individual part shrinkages could cause breakage of the part-to-part joint.

Another problem faced by a designer of a susceptor is the corrosive gasses such as fluorine that are often used during etch processes within the vessel. This creates a harsh environment for the materials used in the vessel including most metals and metal oxides such as alumina. Thus special care must be taken in designing the internal structures of a susceptor apparatus to accommodate the presence of these destructive atmospheres.

One way to overcome the corrosiveness of these processing gases involves using Aluminum Nitride (hereinafter referred to as "AlN") as the ceramic insulating material. AlN is resistant to corrosion by hot flourine gas and other reactive materials.

The coefficient of thermal expansion ("CTE") or simply the thermal expansion of a material is defined as the ratio of the change in length per degree Centigrade to the length at 25 degrees C. It is usually given as an average value over a range of temperatures. The CTE of tungsten and AlN are similar at approximately 4.5 ppm/degree C.

Another consideration is that tungsten oxidizes readily at elevated temperatures when used in processes involving free oxygen. Thus it can be critical to isolate tungsten metallization from exposure to free oxygen during the sintering process and later use in high temperature applications. Thus, the tungsten should be hermetically sealed against such exposure. In typical susceptor applications the level of hermeticity should be adequate to prevent oxidation of tungsten during the expected operational life of the susceptor.

Another consideration involves the thermal conductivity of the materials in the susceptor. The thermal conductivity ("K" or "TC") of a material is defined as the time rate of heat transfer through unit thickness, across unit area, for a unit difference in temperature or K=WL/AT where W=watts, L=thickness in meters, A=area in square meters, and T=temperature difference in degrees C. Thermal conductivity of a material is reduced with increase in temperature above 0 degrees. The pedestal is unheated and operates at a lower temperature compared with the plate, and as a result will have a higher effective thermal conductivity. Heat will be preferentially drawn away from the local region of attach and will upset the thermal uniformity of the heater plate.

The instant invention results from efforts to improve susceptor design using multilayer ceramic technology.

SUMMARY

The primary and secondary objects of the invention are to provide an improved hermetic joining together of ceramic components. These and other objects are achieved by introducing a transient liquid phase promoting additive to the interface between ceramic components.

In some embodiments where aluminum nitride (AlN) is used for the ceramic, a rare earth oxide can be used as the additive.

In some embodiments a ceramic particle infused diffusion paste containing an amount of the transient liquid phase promoting additive can be placed between the pre-fired or unfired green state components to form a ceramic weld between the components during firing or re-firing.

In some embodiments there is provided a process for hermetically joining ceramic components, said process comprising: selecting at least two green state aluminum nitride (AlN) particle components having different aspect ratios, dispersing on and about said contact areas an amount of a transient liquid phase inducing additive comprising a first rare earth oxide in a concentration of about 1-5% by weight of the AlN present; placing said components in mating contact in a substantially contained atmosphere; co-heating said components to a form a transient liquid phase along said contact areas for about 60 to 300 minutes; allowing a vaporized amount of said first rare earth oxide to form in said substantially contained atmosphere, wherein said vaporized amount has a partial pressure of no more than about 1.0 atmosphere, thereby substantially pressurelessly inhibiting further vaporization of said transient liquid phase during said co-heating; and, cooling said components to room temperature.

In some embodiments the process further comprises pressing said areas together during said co-heating.

In some embodiments said pressing comprises applying a pressure of at least 0.75 to 3.0 grams per square centimeter.

In some embodiments said pressing comprises: placing a first of said components on top of the other; sprinkling a lubricating thin layer of AlN particles on top of said first of said components; and, placing a weight on top of said layer.

In some embodiments said atmosphere has a total pressure of no more than about 1.0 atm.

In some embodiments said first rare earth oxide is taken from a group consisting of yttrium oxide, calcium oxide, magnesium oxide, aluminum oxide, oxides of the transition metals, alkali earths and the lanthanum and actinium rare earth series.

In some embodiments said aluminum nitride particles comprise at least 1% by weight oxygen.

In some embodiments said heating comprises raising the ambient temperature to between about 1780° C. and about 1840° C.

In some embodiments said process further comprises a linear shrinkage differential between said contact areas is between about 1 and 5%.

In some embodiments there is provided an article of manufacture comprising: a first component comprising particles of aluminum nitride (AlN) and having a first geometry; said first component comprising a first contact area; a second component comprising particles of aluminum nitride (AlN) and having a second geometry; said second component comprising a second contact area; wherein said first geometry is substantially different from said second geometry; a welded joint extending along said contact areas hermetically bonding said first and second components; and, wherein a portion of said joint consists essentially of: particle regions of aluminum nitride (AlN) by regions of yttrium aluminate (Y—Al—O) having a first concentration of $Y_2O_3$ greater than a second concentration found in a region of one of said components outside said portion.

In some embodiments there is provided a multilayer co-fired ceramic apparatus which comprises: a first multilayer ceramic component having a first set of electronic traces; a second multilayer ceramic component having second set of electronic traces; said first component including a plurality of layers oriented in a first orientation; said second component including a plurality of layers oriented in a second orientation different from said first orientation; and wherein said first and second components are bonded together along a bond zone including an electrically conductive contact between said components.

In some embodiments said first component has a first plural group of electrically conductive contact pads in electrical communication with said first set of traces; said second component has a second plural group of electrically conductive contact pads in electrical communication with said second set of traces; and, said first group being located and oriented to electrically conductively contact said second group when said components are bonded together.

In some embodiments said first orientation is substantially planar.

In some embodiments said second orientation is substantially concentrically cylindrical.

In some embodiments said first orientation is substantially perpendicular to said second orientation.

In some embodiments the apparatus further comprises: said first component comprises a first surface section located in said zone; said second component comprises a second surface section located in said zone; and, a substantially ceramically welded structure contacting said sections; wherein each of said surface sections and said interface structure comprises a material including aluminum nitride.

In some embodiments said welded structure forms a monolithic ceramic weld between said sections.

In some embodiments said material comprises a sintering aid comprising yttrium oxide.

In some embodiments said traces and pads comprise tungsten.

In some embodiments said apparatus is further adapted to operate as an electronically controlled wafer susceptor.

In some embodiments a first subset of said traces acts as heating elements; a second subset of said traces acts as electrical interconnects to thermal sensors; and a third subset of said traces acts as electrical shielding.

In some embodiments said susceptor comprises: a top surface area; wherein said area is subdivided into a plurality of mutually exclusive regions; wherein said first subset comprises separate groupings of said traces located to correspond to said regions.

In some embodiments each of said subsets of said traces is located on a separate region of said first component.

In some embodiments said first component has at least one conduit extending through a plurality of adjacent layers adapted to carry a cooling fluid.

In some embodiments said apparatus further comprises: said first component having an outer tungsten layer; a tungsten block shaped to have cooling fluid carrying channels coursing therethrough; and, said block being brazed to said outer layer.

In some embodiments said apparatus further comprises: a heatsink brazed to said block separately from said first component.

In some embodiments said heatsink comprises copper.

In some embodiments the apparatus further comprises: said first component being a susceptor plate; said second component being a hollow susceptor pedestal; a metallized post inserted through a central lumen in said pedestal and contacting a first plural group of electrically conductive contact pads in electrical communication with said first set of traces.

In some embodiments the apparatus further comprises: said first component being a susceptor plate; said second component being a hollow susceptor pedestal; a metallized trace formed onto an inner surface of said pedestal contacting a first plural group of electrically conductive contact pads in electrical communication with said first set of traces.

In some embodiments there is provided a method of electrically communicatively bonding a first multilayer ceramic component to a second multilayer ceramic component, said method comprises: forming a first multilayer ceramic subassembly having a first group of electrically conductive pads; forming a second multilayer ceramic subassembly having a second group of electrically conductive pads said first subassembly including a plurality of layers oriented in a first orientation; said second subassembly including a plurality of layers oriented in a second orientation different from said first orientation; forming a first patch of slurry material containing electrically conductive particles on said first group; applying a second patch of slurry material containing ceramic particles surrounding said first group; mating said first and second subassemblies including an electrically conductive contact between said first and second groups; and, sintering said subassemblies at a temperature which bonds said first subassembly to said second subassembly through a ceramic weld formed by the sintered result of said second patch.

In some embodiments said method further comprises debinding and sintering said slurry material in a non-dried state.

In some embodiments said method is conducted by applying and sintering electrically conductive and ceramic weld pastes in independent firing steps.

In some embodiments said method is conducted by applying and sintering ceramic weld paste only, where no additional electrically conductive slurry is added.

In some embodiments said first and second subassemblies are formed from a process including predebinding and presintering.

The content of the original claims is incorporated herein by reference as summarizing features in one or more exemplary embodiments.

BRIEF DESCRIPTION OF THE DRAWINGS

FIG. 2 is a diagrammatical perspective view of the plate and pedestal subassemblies of the susceptor.

FIG. 3 is a diagrammatical perspective illustration of the layer orientations of the subassemblies.

DESCRIPTION OF THE EXEMPLARY EMBODIMENTS

The exemplary embodiment of the invention will be described by way of example in the field of the manufacture of a heatable and sensor-infused ceramic susceptor having a ceramic plate component substantially monolithically joined to a ceramic pedestal component. However, it will be apparent that the disclosed method of forming the ceramic joint can be adapted to the appropriately hermetic joining together of other ceramic structures.

A susceptor, sometimes referred to as a heater chuck, can be made primarily out of corrosion resistant ceramic material such as aluminum nitride ("AlN") ceramic and having a plurality of metallized heating element traces, thermal sensors in the form of RTD traces, electronic signal carrying and power interconnect traces and vias, and grounded shielding traces and vias using tungsten.

In at least one embodiment, the susceptor can be manufactured using a bifurcated multilayer, high-temperature ceramic process including the steps of tape casting, blanking, screening, metallization, stacking, laminating, debinding, and first firing of separate plate and pedestal component subassemblies. The subassemblies can be mated at an interface of their intimately mating contact areas using a ceramic weld which can be formed by placing an amount of a ceramic particle infused diffusion paste between the subassemblies, then re-debinding and re-firing both subassemblies simultaneously. The paste includes an amount of a transient liquid phase promoting additive having high wettability characteristics. The re-firing causes a permeation and diffusion of the liquid phases of the paste into the grain boundaries of the ceramic subassemblies located at the interface zones and encourages greater wetting and thus more rapid sintering between adjacent ceramic particles in the material on either side of the interface, thus welding the two components together and essentially eliminating the interface.

Electrical conductivity across portions of the weld zone can be accomplished by using a metallized conductive bonding paste on the aligned, interfacing electronic contact pads located on the respective subassemblies in the contact areas.

Figure 1:
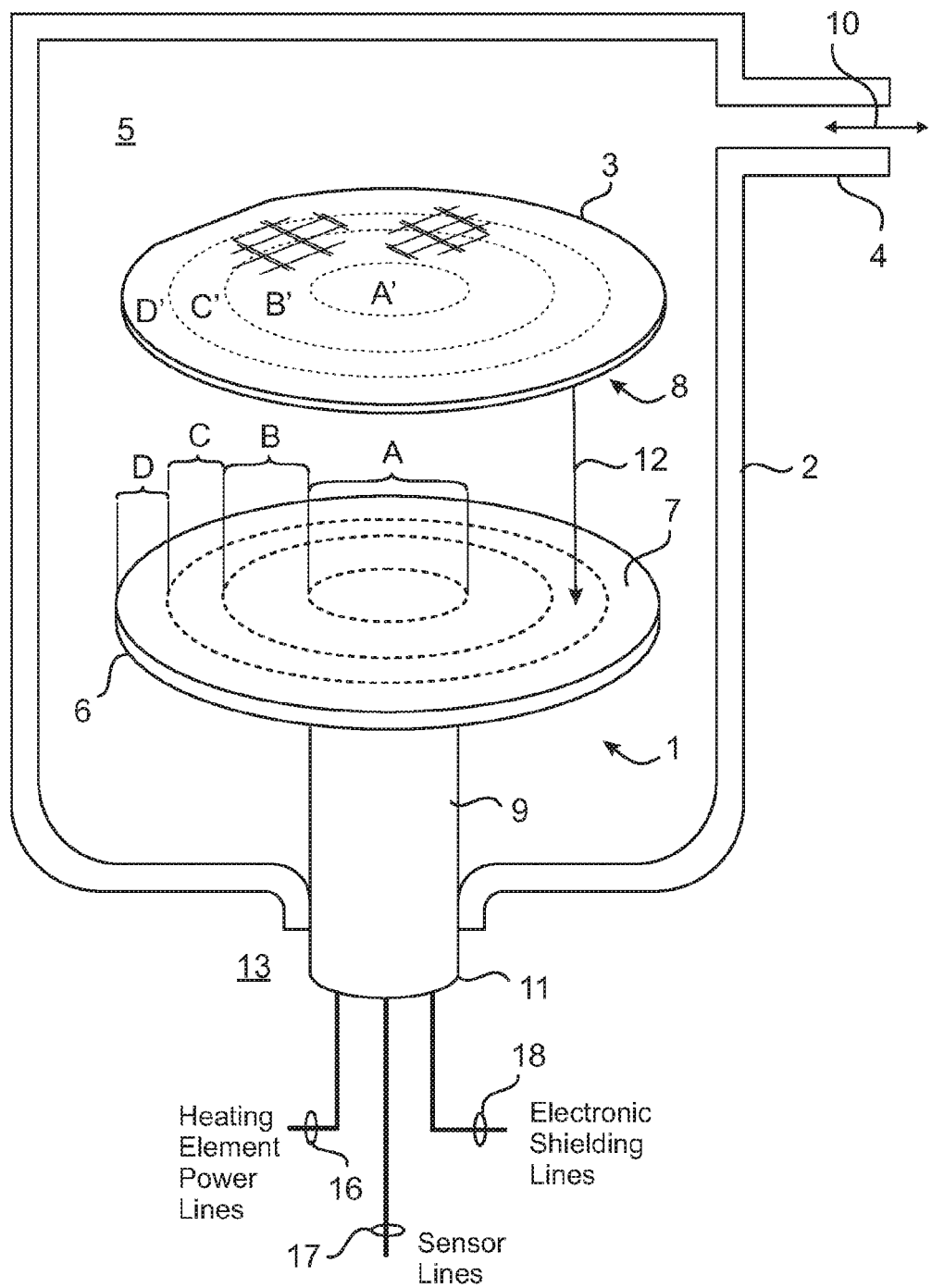
FIG. 1 is a diagrammatical illustration of the wafer fabrication vessel according to an exemplary embodiment of the invention.

Referring now to FIG. 1, there is shown a diagrammatic representation of an improved susceptor apparatus 1 for use within a processing vessel 2 used to clean, etch, and deposit materials in the fabrication of a microelectronic semiconductor integrated circuit wafer 3. The internal chamber 5 of the vessel can be subjected to various environments by gases entering or exiting 10 through one or more ports 4 and/or through the susceptor's hollow pedestal.

The susceptor 1 includes a substantially disk-shaped wafer thermal control plate 6 having a substantially planar top surface 7 providing close proximity to the bottom surface 8 of the wafer when it is secured 12 within the vessel. The part of the susceptor which interfaces with the wafer or its carrier substrate can be termed the susceptor's active area. The plate is mounted upon the proximal end of a substantially cylindrical support pedestal 9 which can pass through the walls of the chamber. Thus the distal end 11 of the pedestal can extend outside 13 the vessel chamber 2.

The support pedestal 9 includes a substantially cylindrical body 15 adapted to electrically interconnect electronic components carried on the plate 6. Specifically, power lines 16 provide power to a plural number of heating elements within the plate. Signal lines 17 carry electronic signals from a plural number of RTD thermal sensors located on the plate. Grounded shielding lines 18 connect to electrical shielding layers carried on the plate.

The top surface 7 of the plate 6 can be subdivided into mutually exclusive regions A, B, C, D corresponding to regions A', B', C', D' on the wafer when the wafer is secured thereon. The susceptor regions can carry separate, subsets of dedicated heating elements and thermal sensors and their electrically interconnecting traces so that the temperature of each of the corresponding wafer regions are separately controlled. It shall be understood that although concentric regions are shown, other region layouts are possible according to fabrication requirements.

Figure 4:
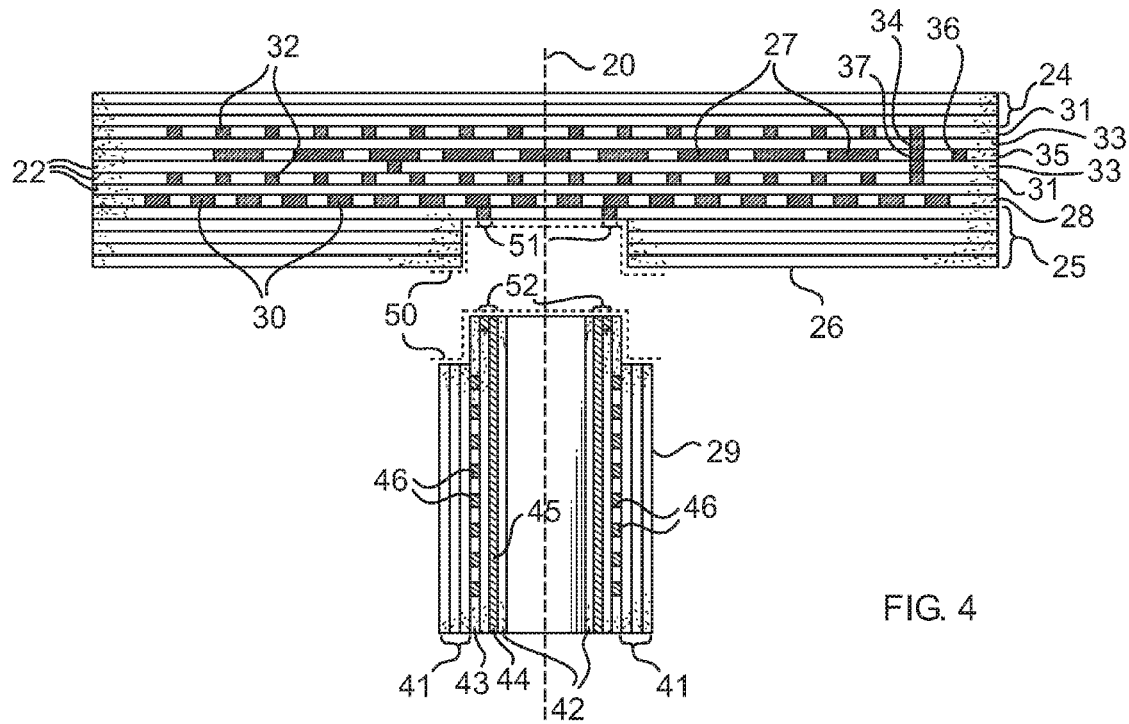
FIG. 4 is a diagrammatical, partial cross-sectional side view of the plate and pedestal subassemblies.

Referring now to FIGS. 2-4, the susceptor 1 can be formed using a bifurcated multilayer ceramic process involving two firing steps separated by a mating step. The first firing step of the process results in a pair of substantially rigid AlN component subassemblies, namely the plate subassembly 26 which will become the plate 6 of the susceptor, and the pedestal subassembly 29 which will become the pedestal 9 of the susceptor. The AlN subassemblies can be welded together using an AlN infused ceramic welding paste containing a transient liquid phase promoting additive and a binder, such as the slurry material used to cast the green tape, which acts as a ceramic welding material or bonding interface structure when the subassemblies and paste are co-fired in a second firing step to form the susceptor ready for final machining and assembly.

The plate subassembly 26 can be made by axially stacking, with respect to an axis 20, substantially planar, disk-shaped layers 22 of green tape oriented in a substantially coplanar orientation to a plane 19 substantially perpendicular to the axis. Some layers such as the top few layers 24, and bottom few layers 25 can remain unmetallized and act as protective ceramic layers for the finished susceptor providing enhances hermeticity. Other layers can be screened and metallized to form one or more layers 35 including RTD sensor traces 27, electrical interconnect traces 37 and shielding traces 36. One or more layers 28 can be metallized to include primarily heating element traces 30, and interconnect and shielding traces. One or more layers 31 can be metallized to include primarily electromagnetic radiation shielding structures 32, and interconnect traces. Intermediate layers 33 can be metallized to carry a number of electrical interconnect traces 34. Thus the plural traces can be distributed throughout the plate to provide thermal control over a plurality of defined regions.

The pedestal subassembly 29 can be made by wrapping curved layers 23 of green tape into a substantially cylindrical shape where the layers are oriented in a substantially radially concentric coaxial orientation with respect to a cylinder 21 and with respect to the axis 20. When laid flat, the layers are substantially rectangular-shaped. The dimensions of successive layers can be selected to accommodate the slightly different diameters of the concentric layers. Further, slight variation can be used to account for the slight deformation of the tape layers during lamination to fill minor gaps and voids between layers.

Some layers such as the outer few layers 41, and inner layer 42 can remain unmetallized and act as protective hermetic ceramic layers for the finished susceptor. Other layers can be screened and metallized to form one or more layers 43, 44 including electrical interconnect traces 45 and shielding traces 46. Thus the plural traces can be distributed within the pedestal to provide electrical connectivity to the plate including a plurality of individual electrically conductive lines.

The center region 48 of the bottom surface of the plate subassembly 26 can be shaped, dimensioned and oriented so that it can intimately engage a commensurately shaped, dimensioned and oriented top end 49 of the pedestal subassembly 29 along mutual interfacing contact areas indicated by dashed lines 50. The bottom surface of the plate within the contact area has a group of electrically conductive contact pads 51 through which the electronics on the plate can communicate. The top surface of the pedestal has a corresponding number or grouping of electrically conductive contact pads 52 located and oriented to contact the group of pads on the plate when the components are welded together. It is understood that a single contact pad formed on the top edge of the pedestal can be made from the metallized portions of one or more adjacent layers as shown.

Further, it is understood that the plate subassembly 26 forms a first component including a plurality of layers oriented in a first orientation, namely planar, and the pedestal subassembly 29 forms a second component including a plurality of layers oriented in a second orientation, namely cylindrical, which is different from the first orientation. Different orientations can also include shapes other than cylinders, and also similarly shaped layers, i.e. both components having a planar shape, but having a different orientation such as where a first plane is horizontal and the other at a non-zero angle with respect to the first plane, such as where the second plane is perpendicular to the first.

Figure 5:
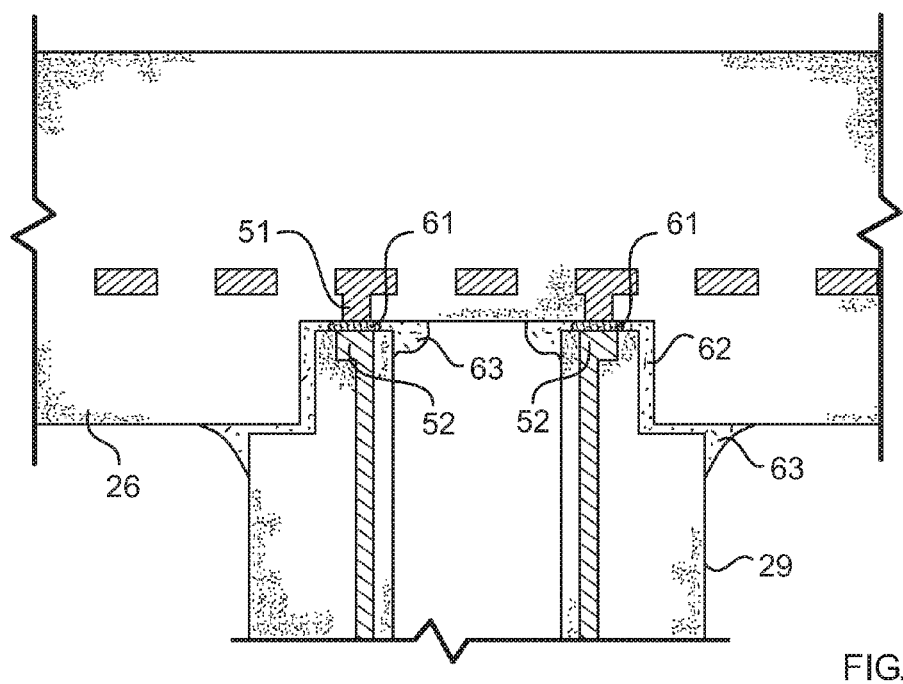
FIG. 5 is a diagrammatical, partial cross-sectional side view of the performs mated with a ceramic infused bonding paste.

Referring now to FIG. 5, there is shown the plate 26 and pedestal 29 subassemblies after being separately fired and subsequently mated together along their respective contact areas. It is noted that the gap shown between the pedestal and plate is exaggerated for clarity. The tolerances of the interfacing surfaces are selected to provide a strong, substantially monolithic welded joining of the plate and pedestal components of the susceptor after re-firing of the mated subassemblies.

Patches of tungsten particle infused bonding paste 61 can be applied to the contact pads 52 of the pedestal subassembly 29. Alternately, or in addition to, patches can be placed on the exposed pads 51 of the plate subassembly. An amount of non-conductive ceramic welding paste 62 can be painted onto the remaining portion of the contact area surfaces surrounding the pads. It is important to isolate the conductive pads from the harsh environment exposed to the outside surfaces of the finished susceptor. Additional beads 63 of ceramic welding paste can be applied to the exposed edges of the contact areas to provide further strengthening support to the eventually welded subassemblies.

The mated subassembly components are then re-fired together in the same sintering furnace. During re-firing, the transient liquid phase formed by the additive along the contact areas permeates and diffuses into regions of the components near the contact areas, wetting the grain boundaries and reacting with the surfaces of the AlN particles to encourage sintering, then de-wetting from those surfaces as the reaction completes. This encourages the components to be hermetically joined to one another. Further, the two components can also be joined together along a contact area zone including one or more electrically conductive contacts between the components.

Figure 6:
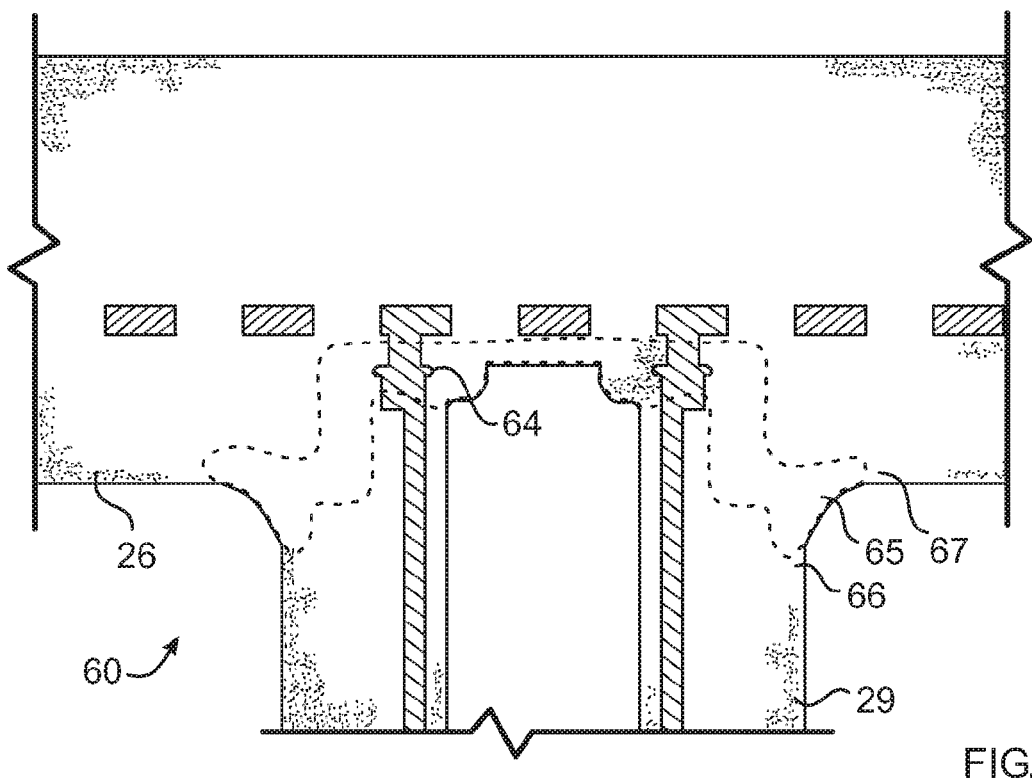
FIG. 6 is a diagrammatical, partial cross-sectional side view of the welded performs after refiring of the mated preforms.

Referring now to FIG. 6, after co-heating the components, there is shown the region 60 of the joint formed between the plate 26 and pedestal 29 components of the susceptor. It has been observed that a substantially monolithic ceramic structure can be formed between and including the re-fired subassemblies and weld material. In other words, the conductive paste has formed a unitary, monolithic connection 64 between the corresponding contact pads of the subassemblies, and the ceramic welding paste has formed a monolithic ceramic material bridge between the subassemblies. Indeed, at 500× magnification, very little if any grain boundaries can be seen between the originally separate components across the joint portion 65 of the welded components indicated by the dotted line. Thus the ceramic portions 66, 67 outside and adjacent to the joint portion, together with the joint portion itself can be said to form a substantially monolithic structure.

Figure 7:
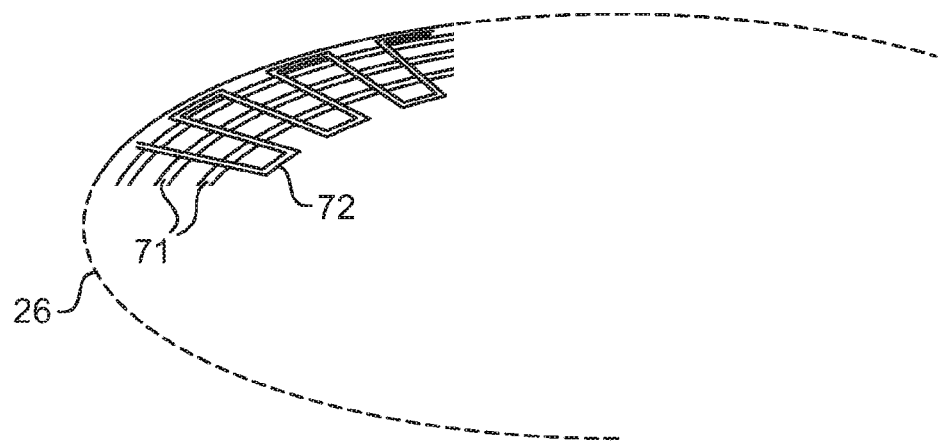
FIG. 7 is a diagrammatical, partial cutaway perspective view of the plate showing substantially orthogonally oriented heater and RTD traces.
Figure 8:
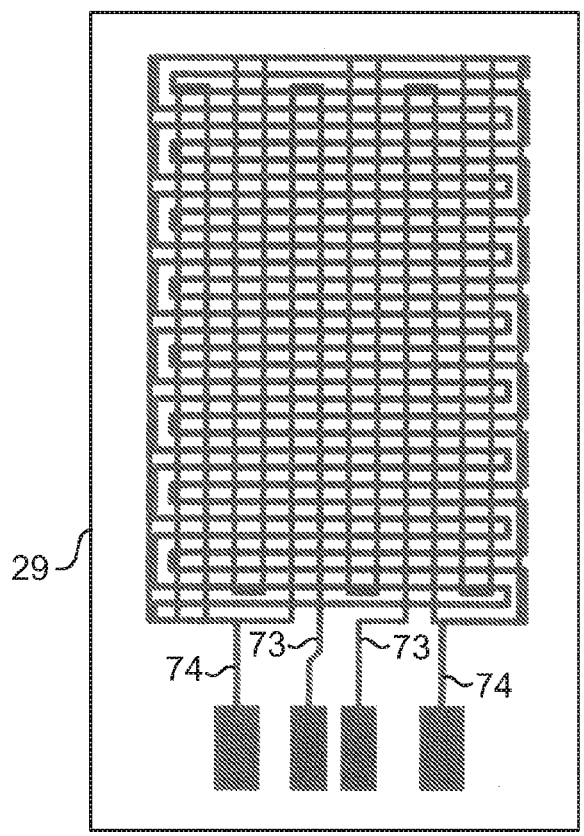
FIG. 8 is a diagrammatical, side view of unwrapped layers of the pedestal showing substantially orthogonally oriented heater power supply and RTD interconnect traces.

Referring now to FIGS. 7 and 8, in order to further reduce electromagnetic interference occurring on the signal lines, the heating traces and electronic interconnect signal traces can be run in a skewed orientation, preferably substantially orthogonal to one another where a planar projection of the signal lines onto the heater lines appear to intersect at an angle of about 90 degrees. The mutually substantially orthogonal orientations of portions of these sets of traces helps to minimize electronic noise being magnetically induced from the high power traces to the lower power, signal traces. In FIG. 7 there is shown an example of how heating traces 71 can be run angularly in a concentric, radially spaced apart, circular manner while RTD sensor traces 72 can be run radially in an angularly spaced apart manner on the plate subassembly 26. Similarly, as shown in FIG. 8 in its unwrapped state, the pedestal 29 can have heater element power supply traces 73 run in a serpentine spaced apart manner while RTD signal line traces 74 can be run in a serpentine spaced apart manner substantially orthogonal to the power supply traces.

Figure 9:
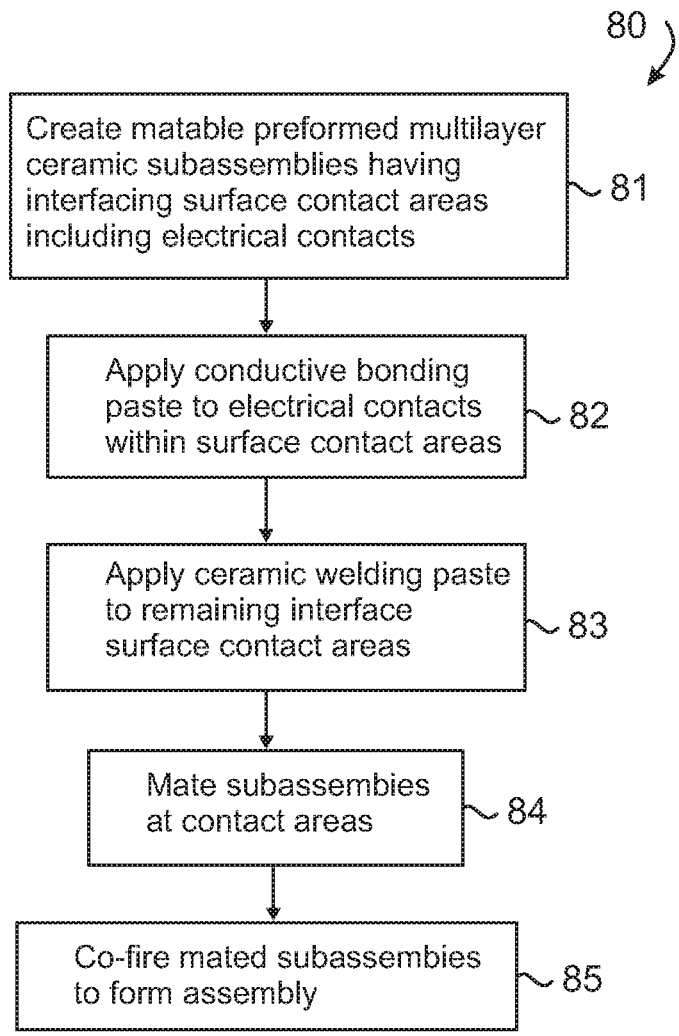
FIG. 9 is a flow diagram of the susceptor manufacturing process according to an exemplary embodiment of the invention.

Referring now to FIG. 9 there is shown a manufacturing process 80 in which partially separately manufactured multilayer ceramic components made primarily of a corrosion resistant ceramic material such as aluminum nitride ("AlN") can be joined together during a final co-firing using a welding paste infused with particles of the same corrosion resistant ceramic material such as an AlN and a transient liquid phase promoting additive. Electrical communication can occur through the bond zone between the two joined components using a metal particle infused, electrically conductive bonding paste.

At least two component subassemblies can be created 81 using multilayer ceramic technology. Each of the subassemblies have surface contact areas shaped and dimensioned to intimately mate with one another along an interfacing contact zone. Each of the contact areas on the respective components can include at least one electrical contact pad oriented, shaped dimensioned and located to interface with a corresponding contact pad on the other subassembly's contact area when the components are mated together.

A conductive paste is formed from particles of a conductive, high melting point metal such as tungsten and a binder. The conductive paste is applied 82 as a slurry in a localized patch onto each of the contact pads on one or both or the components.

An electrically non-conductive welding paste can be formed including particles of ceramic similar to those used in the component tapes, a transient liquid phase promoting additive, and a binder. For example if AlN particles are used to form the green tape used in the layers of the components, then AlN particles can be used in the ceramic welding paste. The transient liquid phase promoting additive can be a rare earth metal oxide such as yttrium oxide. Indeed, it has been found that the undried tape-castable slurry including the transient liquid phase promoting additive can be used as the ceramic welding paste. The ceramic welding paste is applied 83 to areas of the exposed surfaces of the contact areas on one or both or the components. Care is taken in placement of the ceramic welding paste to prevent exposure of metallized portions to outside surfaces of the susceptor intended to be subjected to harsh processing environments.

The subassembly components are mated together 84 at the interfacing contact areas with their contact pads in substantial alignment.

The subassembly components are held together while undergoing a first binder burn-off heating step intended to cause the binder in the pastes to vaporize off, then subsequently, in a co-heating step 85 resulting in the joined apparatus ready for final processing to form the wafer susceptor. In some processes the binder burn-off and joining or sintering together of the two component can be accomplished by a single heating routine.

Figure 10:
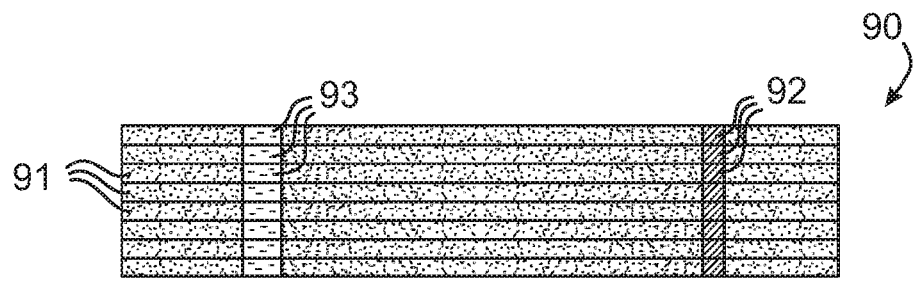
FIG. 10 is a diagrammatical, partial cross-sectional side view of an unsintered subassembly including binder-only filled vias.

As shown in FIG. 10, layers 91 of green tape can be printed or punched and embedded with metallization portions 92 and punched and embedded with binder material inserts 93 and stacked and laminated to form a preform 90.

Figure 11:
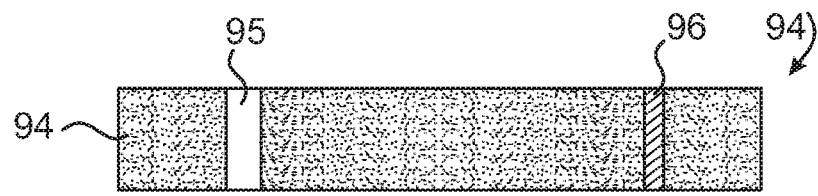
FIG. 11 is a diagrammatical, partial cross-sectional side view of a sintered subassembly of FIG. 10 where the vaporized binder leaves a fluid channel.

As shown in FIG. 11, after debinding and firing, the body 94 made of substantially monolithic ceramic 95 can have metallized lines 96 and open conduits 97 for carrying a flow of fluid such as coolant. Both plates and pedestals can be formed to have conduits and metallized lines.

Figure 12:
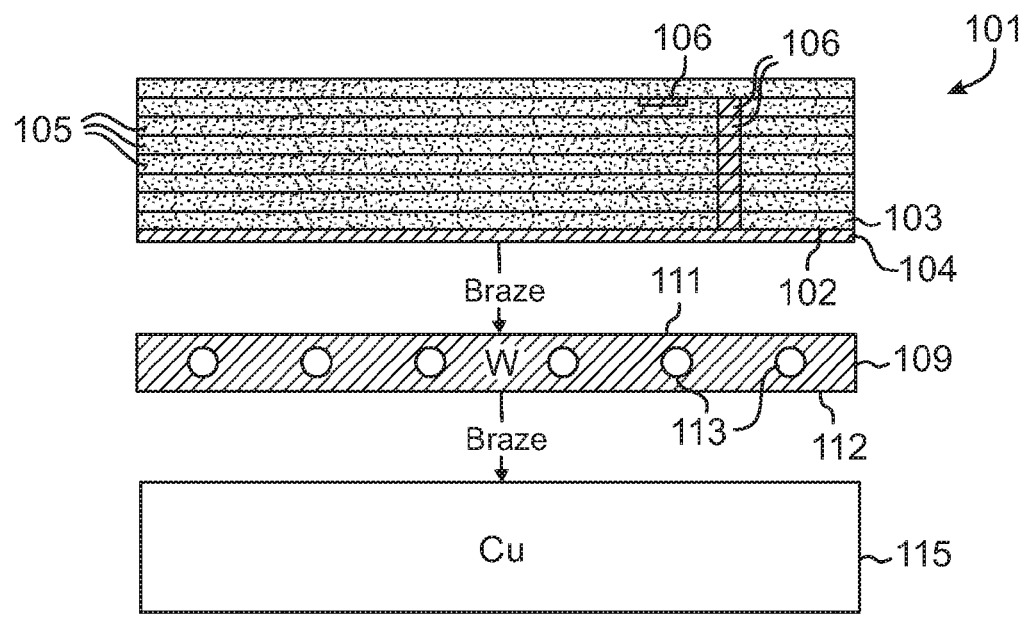
FIG. 12 is a diagrammatical, partial cross-sectional side view of a sintered subassembly having a tungsten metallized bottom surface brazed to a tungsten cooling channel carrying block, brazed to a copper heatsink.

Referring now to FIG. 12 there is shown an alternate embodiment of a susceptor adapted to provide greater cooling control of the susceptor. A portion of the susceptor plate 101 can be formed using a multilayer ceramic process primarily out of layers 105 of green tape including particles of AlN ceramic. The layers can include metallization 106 for heater element traces, RTD traces, interconnect traces, and shielding traces and vias resulting in a monolithic AlN ceramic susceptor that can include heater, sensor, interconnect, and conduits for transfer media such as gases, liquids, and vacuum, and that can be single or multi-zoned for both heating, chilling and the application of other transfer media.

In this embodiment, a bottom surface 102 of a bottom layer 103 of the plate has been fully printed with a layer of tungsten 104.

A separate block 109 of tungsten is formed through machining to have a top surface 111 commensurate with the bottom layer 103 of the plate after sintering. The block has a plurality of channels 113 formed therein which are shaped and dimensioned to carry a cooling fluid therethrough.

After the plate has been sintered it can be brazed to the top surface 111 of the tungsten block using CUSIL brand brazing or gold-tin brazing.

Optionally, a heat sink structure 115 made copper can be brazed to the bottom surface 112 of the tungsten block. In this way the thermal expansion mismatch between the copper heatsink and the AlN ceramic plate can be accommodated by the more flexible block of tungsten. The heatsink can be made of other materials such as tungsten/copper and molybdenum/copper.

Figure 13:
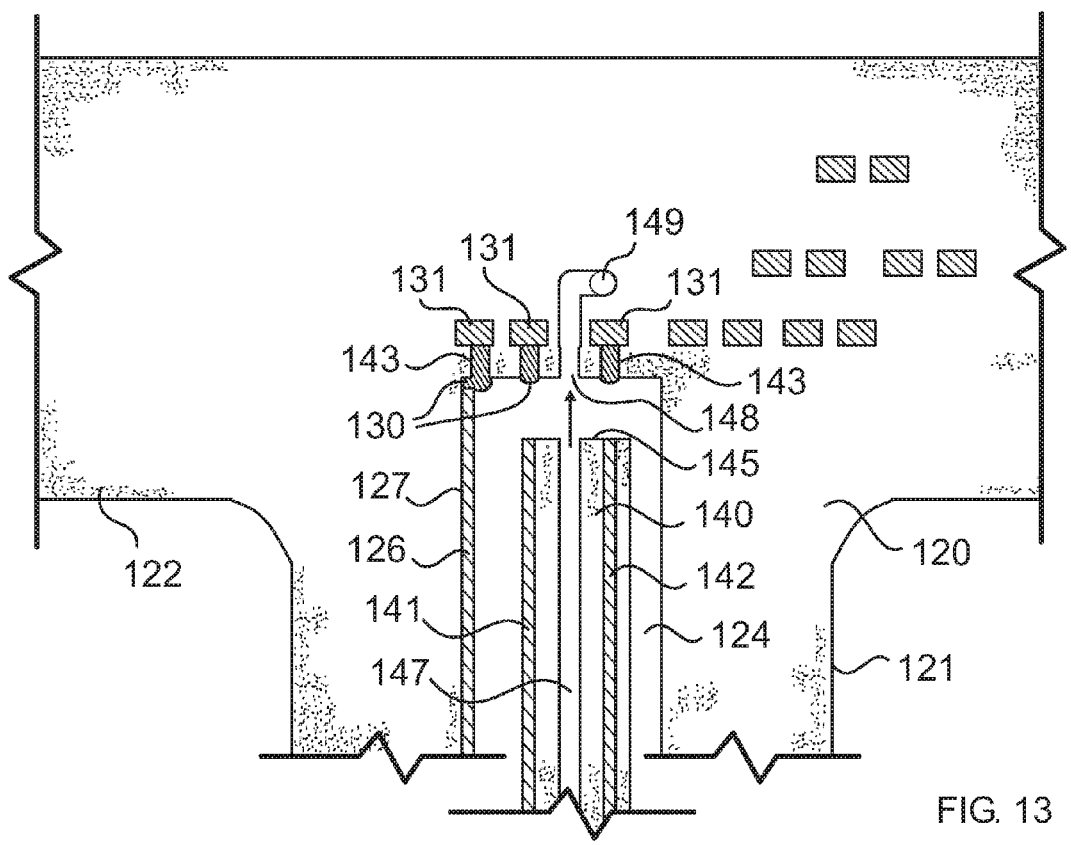
FIG. 13 is a diagrammatical, partial cross-sectional side view of the welded components including internal surface metallization of the pedestal and use of an electrical and fluid-interconnect post.

As shown in FIG. 13, because the junction 120 between the hollow pedestal 121 and the plate 122 can be made hermetic using the transient liquid phase joining process described above, the atmosphere inside the central lumen 124 of the pedestal can be made to be devoid of oxygen during operation of the susceptor. Therefore, gold, copper or tungsten traces 126 or other metallization can be formed on the inner surfaces 127 of the tubular pedestal and bonded to contact pads 130 electrically connected to the traces 131 within the plate by CUSIL brand brazing or other means. Alternately, or in addition to the pedestal inner surface traces, a body in the form of an electronic connection post 140 can be used having its own external traces or wiring 141 and/or internal traces or wiring 142. After the pedestal and plate weld has been formed, bores 143 can be formed in the portion of the plate exposed to the inner lumen 124 of the pedestal and leading to the internal plate traces 131. The bores can be filled with electrically conductive material to form contact pads 130 electrically connected to the underlying traces. The post 140 can be inserted through the pedestal lumen so that the end 145 of the post and its contact pads align with and bond to the plate's contact pads 130. Alternately, or in addition to the above structures, the post can be adapted to carry its own internal lumen 147 aligned with at least one passageway opening 148 formed into the plate leading to internal vias 149 for carrying a cooling fluid. In this way the post can include pathways for electronics, process gasses, liquids, and vacuum channels or combinations of these into the plate and/or the process chamber containing the susceptor.

Now will be described an exemplary ceramic welding paste usable in the above application to weld together at least two separately preformed ceramic components or subassemblies. The paste will include particles of ceramic material substantially similar to the ceramic material used to form the two subassemblies, a transient liquid phase promoting additive, and a carrier or binder.

For example, if the two subassembly preforms are made using particles of AlN, the paste can have particles of AlN within similar size ranges used in the subassemblies.

The transient liquid phase promoting additive will perform as a wetting agent inducer, where the wetting agent preferably exhibits a relatively high wetting angle with respect to the ceramic being wetted. Where perfect wetting exhibits a 0 degree wetting angle and perfect non-wetting exhibits a 180 degree wetting angle, the preferred liquid phase bonding agent will exhibit a wetting angle of near 0 degrees so that the liquid phase can penetrate through the contact areas and into adjacent ceramic particle regions of both components and encourage sintering.

Figure 14:
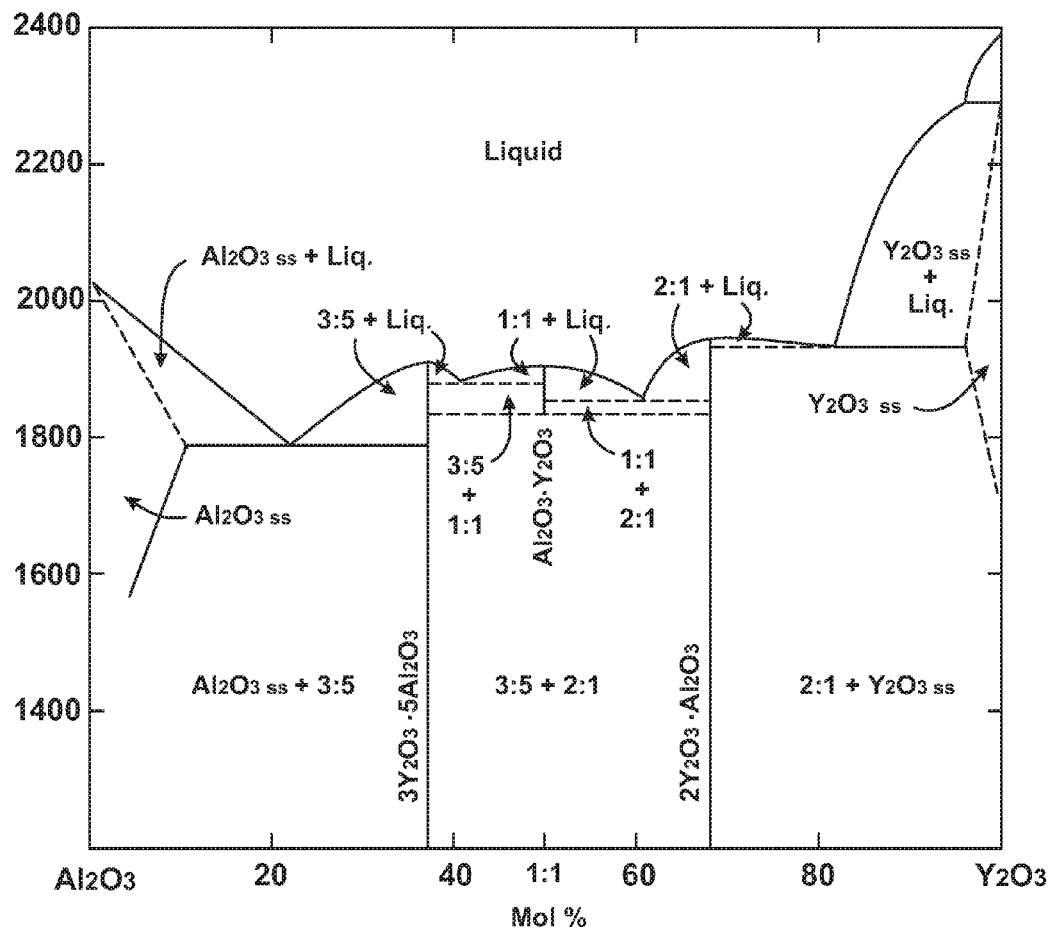
FIG. 14 is a pseudo-binary phase diagram for yttrium aluminate (Y—Al—O) including $Y_2O_3$ and $Al_2O_3$.

The transient liquid phase promoting additive can be selected primarily from rare earth oxides that are compatible with the ceramic particles being sintered. For AlN ceramic material, a rare earth oxide, yttrium oxide ($Y_2O_3$) can be used as the transient liquid phase promoting additive which can, in the presence of aluminum oxide ($Al_2O_3$), form the wetting agent yttrium aluminate Y—Al—O having the phase characteristics shown in the phase diagram of FIG. 14. In order to adjust the phase(s) of Y—Al—O present at the selected firing temperature, additional $Al_2O_3$ can be added to the additive.

AlN particles having at least 1% by weight oxygen of which about 50% is located on the surface and about 50% interspersed within the AlN grains can be used since during firing this oxygen migrates to the surface of the AlN particles contributing to the liquid phase $Al_2O_3$ wetting the surface. Although a eutectic combination of $Al_2O_3$ and $Y_2O_3$ can be desired, in practice it can be difficult to anticipate what contribution the AlN particles will make to the Y—Al—O compound during sintering. It has been found that wide proportions of $AlN/Y_2O_3/Al_2O_3$ can provide adequate liquid phase wetting of the AlN particles during firing. For example ratios of 10/32/58 by weight and 90.4/6.4/3.2 by weight appear to work adequately. Higher concentrations of $Al_2O_3$ and $Y_2O_3$ can be more reactive but also lead to higher diffusion into the regions of the components adjacent to the contact areas.

In addition to yttrium oxides, other rare earth oxides can be used in the transient liquid phase promoting additive such as calcium oxide, magnesium oxide, aluminum oxide, oxides of the transition metals, alkali earths and the lanthanum and actinium rare earth series.

Figure 15:
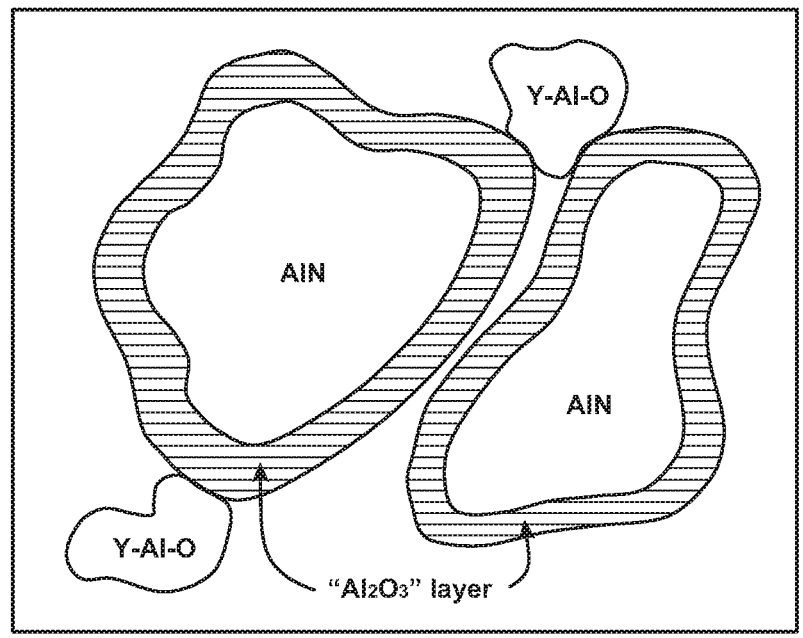
FIG. 15 is a diagrammatical, partial cross-sectional view of a cold mixture of particles of ceramic and a transient liquid phase promoting additive.

As shown in FIG. 15, during re-firing, there is aluminum oxide (alumina) ($Al_2O_3$) both dissolved in the AlN particle and covering the surface of the AlN particle. The alumina coving the surface of the AlN particle is the alumina that initially reacts with the added yttrium oxide ($Y_2O_3$) to form the initial liquid phase.

Figure 16:
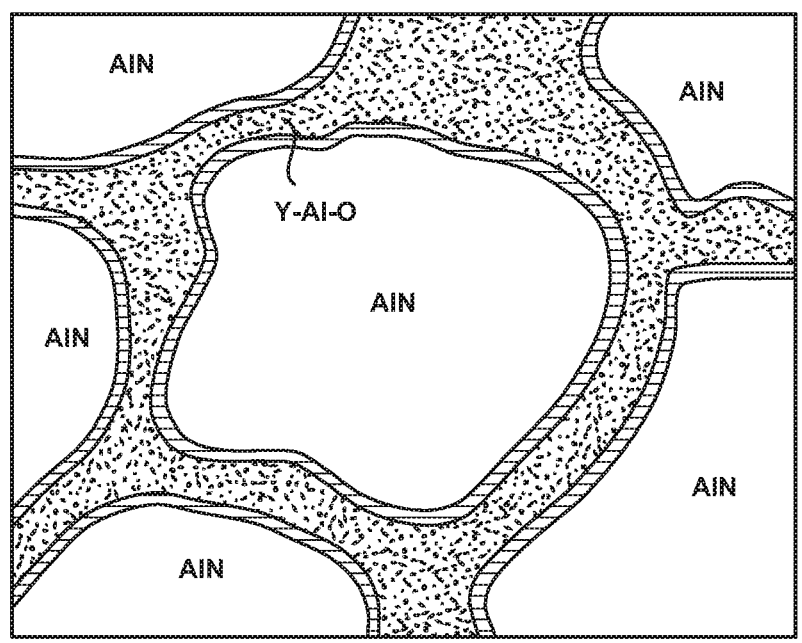
FIG. 16 is a diagrammatical, partial cross-sectional view of a heated mixture of particles of ceramic and a transient liquid phase coating the particles.

As shown in FIG. 16, during the sintering process, the alumina dissolved in the AlN particles/grains slowly diffuses out and also reacts with the yttrium aluminate (Y—Al—O). This chemical reaction between $Al_2O_3$ and $Y_2O_3$ is the driving force for the oxygen diffusion out of the AlN grains.

Figure 17:
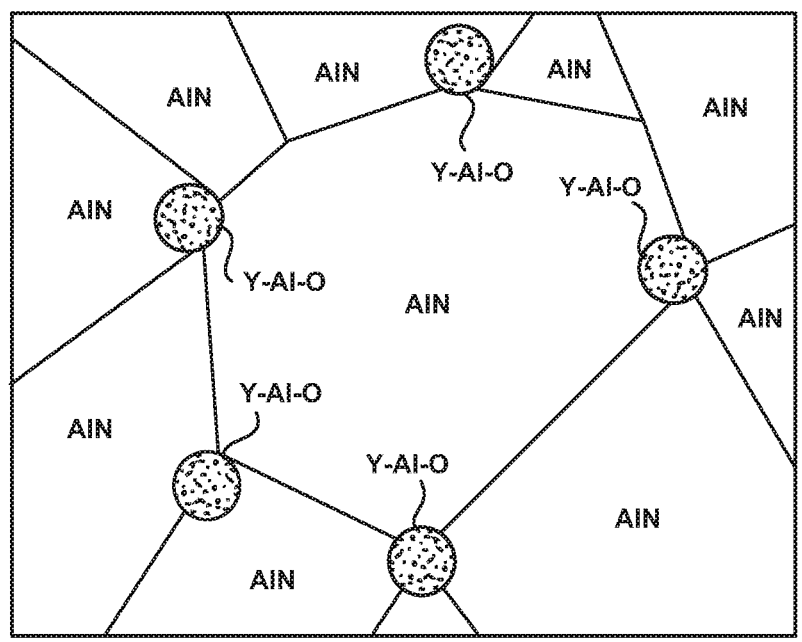
FIG. 17 is a diagrammatical, partial cross-sectional view of a cold monolithic structure of transient liquid phase sintered particles of ceramic.

As shown in FIG. 17, once the surface concentration of alumina on the AlN grains gets low enough, the de-wetting reaction occurs causing the Y—Al—O to collect at the triple points in the microstructure. After cooling the solid result exhibits no distinctive interfacial discontinuity at the junction of the two components.

Example 1

A susceptor was formed including to the following process steps.

The plate and pedestal subassemblies were formed according to a multilayer ceramic process. The green tape used contained approximately 77 to about 80 weight percent ("w %") aluminum nitride (AlN) ceramic powder particles having a largest dimension of between about 1.5 and 2.0 microns, and about 4 to about 6 w % yttria particles as a transient liquid phase promoting additive having a largest dimension of between about 1.5 and 2.0 microns, and about 15 to 18% organic binder which was cast and dried. The metallization on both subassemblies was tungsten. For each subassembly, green tape layers were stacked, laminated, debound and fired.

The non-conductive ceramic welding paste was formed similarly to un-cast the green tape material. The welding paste included approximately 10 weight percent ("w %") aluminum nitride (AlN) ceramic powder particles having a mean largest dimension of about 2.0 microns, about 32 w % yttrium oxide ($Y_2O_3$) particles as a transient liquid phase promoting additive having a mean largest dimension of about 3.0 microns, about 58 w % (alumina) ($Al_2O_3$) particles having a mean largest dimension of about 3.0 microns, and the remainder binder.

The conductive paste was formed by mixing approximately 75 to about 85 weight percent ("w %") tungsten powder particles having a largest dimension of between about 2.0 and 3.0 microns, and similar binder and sintering aids. Although many binder formulations are compatible, the preferred formulation is available from CMC Laboratories of Tempe, Ariz.

Patches of the conductive paste were applied to the contact pads of the pedestal. An amount of non-conductive welding paste was painted onto the remaining portion of the contact area surfaces surrounding the pads.

The subassemblies were mated together along their contact areas.

The mated subassemblies were placed in a binder burn-off oven and the temperature slowly ramped to about 400 degrees centigrade. The debound mated subassemblies were then placed in a sintering oven in a nitrogen-hydrogen atmosphere at about atmospheric pressure and brought to about 1825 degrees centigrade for approximately 60 to about 120 minutes.

The fired product was then allowed to cool to room temperature.

After cooling, the sintered susceptor exhibited a specific gravity of about 3.3 $g/cm^3$, as compared to about 3.33 $g/cm^3$ specific gravity that would result from a perfectly solid structure.

The concentration of $Y_2O_3$ in the portions of the product near the joint were greater than the concentration of $Y_2O_3$ in the portions of the product more distant from the joint. In other words, the presence of the sintering additive near the joint leaves a residual higher concentration of $Y_2O_3$ in the Y—Al—O remaining at the triple points in that part of the product. Thus, with reference to FIG. 6, it was found that the material in the joint portion 65 includes particle regions of yttrium aluminate (Y—Al—O) having a concentration of $Y_2O_3$ greater than the concentration of $Y_2O_3$ found in particle regions of Y—Al—O located in the ceramic portions 66,67 outside the joint portion.

Observation under 1,000× magnification of the susceptor manufactured according to this example, showed consistent homogeneity of grain interfaces.

Because AlN exhibits a higher thermal conductivity of about 170 W/m-K over that of alumina at about 20 W/m-K, AlN can provide better uniformity of temperature across the susceptor plate.

In this way the electrical termination of the susceptor can occur at the distal end of the tube, far away from the harsh environment of the plate and proximal end of the pedestal. Thus, cheaper, more reliable, less ruggedized electrical connectors to the susceptor can be used.

In this way, it has been found that the pedestal can be made to accommodate enough lines to be able to control up to six separate thermally controllable regions on the plate.

In this way the susceptor can be scalable to future, larger or differently shaped wafers and to provide even finer control over thermal regions on the plate by creating more zones, including more sensors and providing more interconnect lines.

In this way it has been found that a susceptor can have an active area having an operational temperature uniformity where temperature differences between separate points on said active area will not exceed +/−2% as measured in air and in some application better than about 1% as measured in air. Of course the uniformity can be better in actual processing environments.

In an alternate embodiment of the invention, the plate 6 and the pedestal 9 are not pre-debound and then welded together by a non-conductive paste, but instead are mated in the green state and co-debound and co-fired. The co-firing homogeneously edge-blends the components to form a hermetic joint between two uniform microstructures. The transient liquid phase promoting additive is added to the initial unfired AlN ceramic components, typically a rare earth oxide, preferably yttrium oxide ($Y_2O_3$) that is dispersed into the green state structures near boundary zone of the contact areas of the plate and pedestal.

More specifically, particles of $Y_2O_3$ can be dispersed into the green tape mixture of AlN used for both the plate and the pedestal in a ratio of approximately 1-7% $Y_2O_3$ of the total weight the AlN+$Y_2O_3$ content.

The plate and pedestal preform components can be made having significantly different shapes and dimensioning, as well as differently oriented green tape layers. These different geometries can lead to different shrinkage of the components at their contact areas. Thus the two differently shaped and dimensioned ceramic components can be said to have different shrinkage aspect ratios from one another which could lead to cracks or other imperfections formed between the joined components.

The furnace temperature is slowly raised to 1850 degrees C. triggering a transient liquid phase which promotes densification and bonding of the components.

During firing, the liquid aluminum oxide ($Al_2O_3$) forming on the surface the aluminum nitrate (AlN) ceramic grains combines with the yttrium oxide ($Y_2O_3$) supplied by the additive to form a yttrium aluminate Y—Al—O compound in near to a eutectic system so that a transient liquid phase is achieved surrounding the remaining solid phase AlN particles as shown diagrammatically in FIG. 16.

Oxygen depletion on the surface of the AlN grains results in de-wetting of the AlN surfaces and migration of the Y—Al—O to the triple points in the microstructure in both original ceramic components as well as their junction area. The solid result is the formation of a monolithic body consisting of AlN grains with Y—Al—O grains located primarily at the triple points in the AlN microstructure as shown diagrammatically in FIG. 17, and thus exhibiting no distinctive interfacial discontinuity at the junction of the two components.

Figure 18:
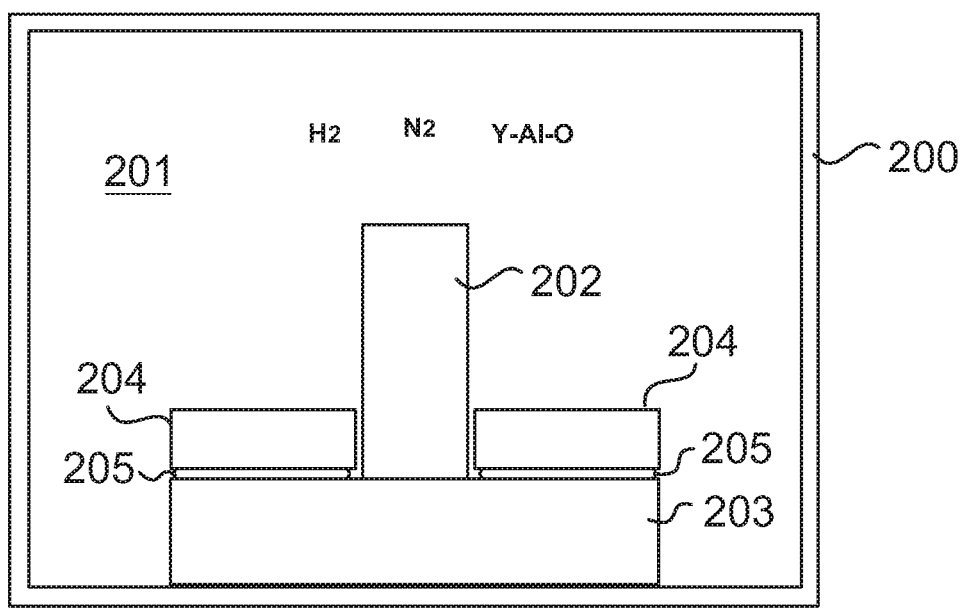
FIG. 18 is a diagrammatical, partial cross-sectional side view of mated components in a sintering furnace having an upper weight and partial vapor pressure controlled atmosphere.

As shown in FIG. 18 in order to assure uniform bonding and to help control the differential in shrinkage between the components, the mated components 202, 203 are enclosed in a receptacle 200 in which the enclosed atmosphere 201 includes a partial pressure of vapor of the same composition as the non-AlN compound liquid phase in the ceramic body. The partial pressure is maintained so that it is in substantial equilibrium with liquid phase present in the components. Typically, a volatile oxide partial pressure of up to 1 atmosphere is maintained. This atmosphere stabilizes the liquid phase promoting a uniform formation of the joint. The receptacle need not be hermetic, thus the atmosphere inside the receptacle can said to be substantially enclosed.

In order to restrain differential shrinkage and resulting deformation of the separate green state components 202, 203, a weight 204 is positioned over the plate component to help restrict its shrinkage in the lateral direction. Preferably the weight is a volume of tungsten or ceramic that can withstand the atmosphere of the furnace chamber. It shall be understood that the force can be applied non-isostatically, differentially or otherwise in directionally dis-uniform manner by placing the weight atop the component in which shrinkage can be directionally controlled. The force can be applied on any component of the assembly in the direction of preferred additional shrinkage or orthogonally to the direction of preferred reduced shrinkage.

In other words, this non-AlN, liquid phase of Y—Al—O is essentially a eutectic combination of $Al_2O_3$ and $Y_2O_3$ which during sintering is in equilibrium with a vapor phase of similar composition outside the components. If the vapor was not trapped surrounding the components, more vapor would continually evaporate from the liquid to achieve equilibrium of the furnace atmosphere and eventually deplete the amount of transient liquid phase present in the ceramic. This depletion of the liquid in the ceramic would effectively stop further transient liquid phase bonding. Since the liquid vaporizes from the surfaces and edges of the ceramic body first, these locations would not shrink uniformly. Thus the enclosure is critical to bonding two separate green state components having potentially very different shrinkage profiles were they sintered separately. It has been found that linear shrinkage differentials appearing in the separately fired components of up to 5% in the intended contact areas can be accommodated when the parts are fired together using the above process.

Therefore, by trapping the vapor surrounding the components during firing, the amount of liquid phase Y—Al—O is stabilized to allow full wetting and achieve adequately dense sintering. Further, low cost manufacturing is maintained by making the process essentially "pressureless" by maintaining the atmosphere during sintering surrounding the components at approximately one atmosphere. This is easily accomplished by allowing for a non-gas-proof seal of the sintering chamber. In this way, the combined partial pressures of the vapor phase Y—Al—O and any reducing gas components, such as $N_2$ or $H_2$, will be approximately one atmosphere. Thus the partial pressure of the Y—Al—O vapor will be no greater than approximately one atmosphere.

It is also useful to press the two components together during the firing and liquid phase bonding process in order to prevent distortion of the contact surfaces. For most plates used in susceptor assemblies, a pressure of between about 0.75 to 3.0 grams per square centimeter has been found adequate.

It is also useful to allow the component 202 to shrink beneath the weight 204 without adhering to the surface of the weight. This can be facilitated by applying a lubricating thin layer 205 (thickness exaggerated in the drawing) of AlN particles on top surface of the upper component. A powder 205 of relatively large size aluminum nitrate particles of approximately 0.25 to 0.5 millimeter in diameter can therefore be sprinkled between the weight and the top structure as a lubricant to facilitate lateral expansion of the ceramic structure in relation to the weight. The particles can be sprinkled on in a manner similar to corn meal on pizza dough. Thereafter, the weight can be placed on top of the layer of lubricating particles.

Example 2

An amount of green tape is cast from a mixture of AlN particles, an organic binder and a transient liquid phase promoting additive in the following proportions by weight percent of the total mixture. Between about 93 and 97 weight percent AlN particles coated with alumina having a mean particle width of between about 1 and 2 micrometer are selected. Between about 3 and 7 weight percent $Y_2O_3$ particles having a mean particle width of between about 1 and 10 micrometer are selected. The balance of the mixture includes primarily binder.

Green sheets having a thickness or between about 75 microns and about 750 microns were cast. The sheets were imprinted with vias and metallization traces, stacked and laminated to form two separate preforms. The preforms were brought together in a vertically stacked orientation in an enclosed though not completely gas sealed sintering oven. A weight made of AlN material of approximately 100 to 300 grams was placed upon the upper one of the two preforms to cause more controlled geometric shrinkage. The surface area of the weight was at least a large as the highest elevation surface of the upper preform. The oven was made to have an atmosphere of about 1 to 5% by total atmosphere weight $H_2$, and the balance $N_2$.

The preforms were heated according to the following firing profile. In a first binder burn-off phase the temperature slowly ramped to about 400 degrees centigrade. The debound mated components were then heated to about 1825 degrees centigrade for approximately 60 to about 120 minutes. The atmosphere was allowed to accept and substantially contain vaporized Y—Al—O gas partial pressure of no more than about 1.0 atmosphere thus inhibiting further vaporization of the liquid phase Y—Al—O.

After cooling the part exhibited a final monolithic body density of more than 97%, with a potential for greater than 99%. The joint area between the components were tested for hermeticity and found in a He test could reach less than about $10^{-6}$ atmosphere cc/second, and often more preferably less than about $10^{-8}$ atmosphere cc/second with no evidence of cracking or other defects in a 30× optical inspection.

It shall be understood that either of the above processes can be adapted to form the monolithically joined component parts without there being any electrical pathways coursing through the joint between the components. After the multi-component part is formed metallized lines or other electronic pathways can be established using well-know post-fire bonding techniques.

While the preferred embodiment of the invention has been described, modifications can be made and other embodiments may be devised without departing from the spirit of the invention and the scope of the appended claims.

What is claimed is:

1. A process for joining ceramic components, said process comprising:
    selecting at least two green state aluminum nitride (AlN) particle components having different aspect ratios, and containing an amount of a transient liquid phase inducing additive comprising a first rare earth oxide in a concentration of about 1-5% by weight of the AlN present,
    each of said components having a contact area shaped and dimensioned to intimately contact the contact area of an other of said components when said components are matingly contacted to one another;
    placing said components in mating contact in a substantially contained atmosphere;
    co-heating said components to a form a transient liquid phase along said contact areas for about 60 to 300 minutes;
    allowing a vaporized amount of said first rare earth oxide to form in said substantially contained atmosphere, wherein said vaporized amount has a partial pressure of no more than about 1.0 atmosphere, thereby substantially pressurelessly inhibiting further vaporization of said transient liquid phase during said co-heating; and,
    cooling said components to room temperature.

2. The process of claim 1, which further comprises pressing said areas together during said co-heating.

3. The process of claim 2, wherein said pressing comprises applying a pressure of at least 0.75 to 3.0 grams per square centimeter.

4. The process of claim 2, wherein said pressing comprises:
    orienting said components in a top and bottom orientation;
    sprinkling a lubricating thin layer of AlN particles upon an exposed top surface of a first of said components, said exposed top surface being located apart from said contact areas; and,
    placing a weight on top of said layer.

5. The process of claim 1, wherein said atmosphere has a total pressure of no more than about 1.0 atm.

6. The process of claim 1, wherein said first rare earth oxide is taken from a group consisting of yttrium oxide and oxides of the lanthanum rare earth series.

7. The process of claim 1, wherein said aluminum nitride particles comprise at least 1% by weight oxygen.

8. The process of claim 1, wherein said co-heating comprises raising the ambient temperature to between about 1780° C. and about 1840° C.

9. The process of claim 1, wherein a linear shrinkage differential between said contact areas is between about 1 and 5% for a set of items identical to said components and sintered separately according to said co-heating step.

10. The process of claim 1, which further comprises:
    metallizing an exposed surface of at least one of said components after said cooling.

11. The process of claim 1, which further comprises:
    bonding a body to an outer surface of at least one of said components after said cooling, wherein said body comprises pathways selected from the group consisting of: electronic pathways; process gas pathways; temperature adjusting fluid pathways; vacuum channel pathways; and, combinations thereof.

* * * * *